US009448922B2

(12) United States Patent
Trika et al.

(10) Patent No.: US 9,448,922 B2
(45) Date of Patent: Sep. 20, 2016

(54) HIGH-PERFORMANCE STORAGE STRUCTURES AND SYSTEMS FEATURING MULTIPLE NON-VOLATILE MEMORIES

(75) Inventors: Sanjeev N. Trika, Portland, OR (US); Knut S. Grimsrud, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 13/997,845

(22) PCT Filed: Dec. 21, 2011

(86) PCT No.: PCT/US2011/066641
§ 371 (c)(1),
(2), (4) Date: Jun. 25, 2013

(87) PCT Pub. No.: WO2013/095465
PCT Pub. Date: Jun. 27, 2013

(65) Prior Publication Data
US 2013/0304978 A1    Nov. 14, 2013

(51) Int. Cl.
*G06F 12/02* (2006.01)
*G11C 13/00* (2006.01)

(52) U.S. Cl.
CPC ....... *G06F 12/0246* (2013.01); *G11C 13/0004* (2013.01); *Y02B 60/1225* (2013.01)

(58) Field of Classification Search
CPC .................................................. G06F 12/0246
USPC ................ 711/103, 118, 154, 156; 365/163, 365/185.11, 185.33
See application file for complete search history.

(56) References Cited

U.S. PATENT DOCUMENTS

| | | | |
|---|---|---|---|
| 5,912,839 A | 6/1999 | Ovshinsky et al. | |
| 6,105,119 A * | 8/2000 | Kerr et al. | 711/219 |
| 6,179,489 B1 * | 1/2001 | So et al. | 718/102 |
| 6,298,370 B1 * | 10/2001 | Tang et al. | 718/102 |
| 7,590,918 B2 | 9/2009 | Parkinson | |
| 7,600,078 B1 | 10/2009 | Cen et al. | |
| 7,756,053 B2 | 7/2010 | Thomas et al. | |
| 7,827,283 B2 * | 11/2010 | Naik | H04L 29/06 709/226 |
| 7,913,147 B2 | 3/2011 | Swaminathan et al. | |

(Continued)

FOREIGN PATENT DOCUMENTS

WO    2006112794 A1    10/2006
WO    2010074352 A1    7/2010

OTHER PUBLICATIONS

International Search Report and Written Opinion for PCT/US2011/066641 mailed Sep. 7, 2012, 20 pages.

(Continued)

*Primary Examiner* — Stephen Elmore
(74) *Attorney, Agent, or Firm* — Blakely, Sokoloff, Taylor & Zafman LLP

(57) ABSTRACT

A memory storage system that includes at least a storage controller, a first non-volatile, solid-state memory and a second non-volatile, solid-state memory. The storage controller has an interface to receive commands from a host system. The first non-volatile, solid-state memory device is coupled with the storage controller to at least store data received from the host system. The second non-volatile, solid-state memory is coupled with the storage controller to store context information corresponding to the data stored in the first non-volatile, solid-state memory device.

22 Claims, 3 Drawing Sheets

(56) References Cited

U.S. PATENT DOCUMENTS

| | | | |
|---|---|---|---|
| 7,937,526 B1 | 5/2011 | Sutardja | |
| 7,950,019 B2* | 5/2011 | Craft et al. | 719/313 |
| 8,266,367 B2 | 9/2012 | Yu et al. | |
| 8,462,537 B2 | 6/2013 | Karpov et al. | |
| 8,462,577 B2 | 6/2013 | Zeng et al. | |
| 8,463,948 B1 | 6/2013 | Qawami et al. | |
| 8,605,531 B2 | 12/2013 | Kau et al. | |
| 8,607,089 B2 | 12/2013 | Qawami et al. | |
| 8,612,676 B2 | 12/2013 | Dahlen et al. | |
| 8,612,809 B2 | 12/2013 | Casper et al. | |
| 8,649,212 B2 | 2/2014 | Kau et al. | |
| 8,838,935 B2 | 9/2014 | Hinton | |
| 8,995,161 B2* | 3/2015 | Barkley et al. | 365/51 |
| 9,021,227 B2* | 4/2015 | Karpov et al. | 711/167 |
| 9,317,429 B2 | 4/2016 | Ramanujan | |
| 2005/0030787 A1* | 2/2005 | Lowrey et al. | 365/163 |
| 2006/0056234 A1* | 3/2006 | Lowrey | 365/163 |
| 2007/0005922 A1 | 1/2007 | Swaminathan et al. | |
| 2007/0094445 A1* | 4/2007 | Trika et al. | 711/113 |
| 2008/0016269 A1 | 1/2008 | Chow et al. | |
| 2008/0034148 A1 | 2/2008 | Gower | |
| 2008/0082766 A1 | 4/2008 | Okin et al. | |
| 2008/0270811 A1 | 10/2008 | Chow et al. | |
| 2009/0037652 A1 | 2/2009 | Yu et al. | |
| 2009/0132752 A1 | 5/2009 | Poo et al. | |
| 2009/0172280 A1* | 7/2009 | Trika et al. | 711/115 |
| 2009/0193184 A1 | 7/2009 | Yu et al. | |
| 2009/0278107 A1* | 11/2009 | Kim et al. | 257/2 |
| 2009/0313416 A1 | 12/2009 | Nation | |
| 2010/0037002 A1 | 2/2010 | Bennett | |
| 2010/0131827 A1 | 5/2010 | Sokolov | |
| 2010/0169604 A1* | 7/2010 | Trika et al. | 711/170 |
| 2010/0250833 A1* | 9/2010 | Trika | 711/103 |
| 2010/0252795 A1* | 10/2010 | Song et al. | 257/2 |
| 2010/0291867 A1 | 11/2010 | Abdulla et al. | |
| 2010/0293317 A1 | 11/2010 | Confalonieri et al. | |
| 2010/0306446 A1 | 12/2010 | Villa et al. | |
| 2010/0306453 A1 | 12/2010 | Doller | |
| 2010/0318718 A1 | 12/2010 | Eilert et al. | |
| 2011/0153916 A1 | 6/2011 | Chinnaswamy et al. | |
| 2011/0208900 A1 | 8/2011 | Schuette et al. | |
| 2011/0291884 A1 | 12/2011 | Oh et al. | |
| 2013/0268725 A1* | 10/2013 | Faber | 711/103 |
| 2013/0268728 A1 | 10/2013 | Ramanujan et al. | |
| 2013/0275661 A1 | 10/2013 | Zimmer et al. | |
| 2013/0282967 A1 | 10/2013 | Ramanujan | |
| 2013/0290597 A1 | 10/2013 | Faber | |
| 2013/0304980 A1 | 11/2013 | Nachimuthu et al. | |
| 2013/0318288 A1* | 11/2013 | Khan et al. | 711/103 |
| 2014/0040550 A1 | 2/2014 | Nale et al. | |
| 2014/0075107 A1 | 3/2014 | Qawami et al. | |
| 2014/0082262 A1 | 3/2014 | Nachimuthu et al. | |
| 2014/0129767 A1 | 5/2014 | Ramanujan et al. | |
| 2014/0297938 A1 | 10/2014 | Puthiyedath et al. | |

OTHER PUBLICATIONS

International Preliminary Report on Patentability for PCT/US2011/066641 mailed Jul. 3, 2014, 8 pages.

Lee et al., "Architecting Phase Change Memory as a Scalable DRAM Alternative", ISCA '09, Jun. 20, 2009, 12 pgs., Austin, Texas, USA.

Condit et al., "Better I/O Through Byte-Addressable, Persistent Memory", SOSP '09, Oct. 11, 2009, pp. 133-146. Big Sky, Montana, USA.

Freitas et al., "Storage-class memory: The next storage system technology", IBM J. Res. & Dev., Jul./Sep. 2008, pp. 439-447, vol. 52, No. 4/5.

Akel et al., "Onyx: A Prototype Phase Change Memory Storage Array",www.flashmemorysummit.com/ .../Proceeding_2011/08/11_S301_Akel.pdf, 5 pgs.

Mearian, "IBM announces computer memory breakthrough Phase-change memory offers 100 times the write performance of NAND flash", Jun. 30, 2011, 3 pgs.

Caulfield et al., "Moneta: A High-performance Storage Array Architecture for Next-generation, Non-volatile Memories", MICRO 43: Proceedings of the 43rd Annual IEEE/ACM International Symposium on Microarchitecture, Atlanta, GA Dec. 2010 pp. 385-395.

"The Non-Volatile Systems Laboratory Coding for non-volatile memories", http://nvsl.ucsd.edu/ecc, printed Sep. 1, 2011. 2 pgs.

"The Non-Volatile Systems Laboratory Moneta and Onyx: Very Fast SS", http://nvsl.ucsd.edu/moneta/, 3 pgs., Sep. 1, 2011.

"The Non-Volatile Systems Laboratory NV-Heaps: Fast and Safe Persistent Objects", http://nvsl.ucsd.edu/nvuheaps/, 2 pgs., Sep. 1, 2011.

"Phase change memory-based 'moneta' system points to the future of computer storage", ScienceBlog, Jun. 2, 2011, 7 pgs.

Quereshi et al., "Scalable High Performance Main Memory System Using Phase-Change Memory Technology", ISCA '09, Jun. 20, 2009, 10 pgs., Austin, Texas, USA.

Kant, Dr. Krishna, "Exploiting NVRAM for Building Multi-Level Memory Systems", International Workshop on Operating System Technologies for Large Scale NVRAM, Oct. 21, 2008, Jeju, Korea, 19 pages.

Bailey et al., "Operating System Implications of Fast, Cheap, Non-Volatile Memory" 13th USENIX, HOTOS11 2011, May 9-11, 2011, 5 pgs.

Raoux et al., "Phase-change random access memory: A scalable technology", IBM J. Res. & Dev., Jul./Sep. 2008, pp. 465-479, vol. 52, No. 4/5.

Chen et al., "Rethinking Database Algorithms for Phase Change Memory", 5th Biennial Conference on Innovative Data Systems Research (CIDR '11), Jan. 9, 2011, 11 pgs., Asilomar, California, USA.

Jacob et al., "The Memory System You Can't Avoid It, You Can't Ignore It, You Can't Fake It", 2009, 77 pgs., Morgan & Claypool.

Mogul et al., "Operating System Support for NVM+DRAM Hybrid Main Memory", 12th Workshop on Hot Topics in Operating Systems (HatOS XII), May 18, 2009, 9 pgs.

\* cited by examiner

HIGH-PERFORMANCE STORAGE STRUCTURES AND SYSTEMS FEATURING MULTIPLE NON-VOLATILE MEMORIES

TECHNICAL FIELD

Embodiments of the invention relate to techniques for improving performance of storage systems. More particularly, embodiments of the invention relate to techniques for improving performance of storage systems that utilize solid-state drives (SSDs) and other storage devices.

BACKGROUND

Current storage systems that utilize non-volatile solid-state drives (SSDs) typically utilize dynamic random access memory (DRAM) to maintain state information and other information related to the data stored in the non-volatile memory (NVM) in the SSD. This is because the DRAM is typically faster than the NVM. However, because DRAM is volatile, use of DRAM in the SSDs may present complexities and opportunities for data loss that can result in undesirable results.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Figure 1:
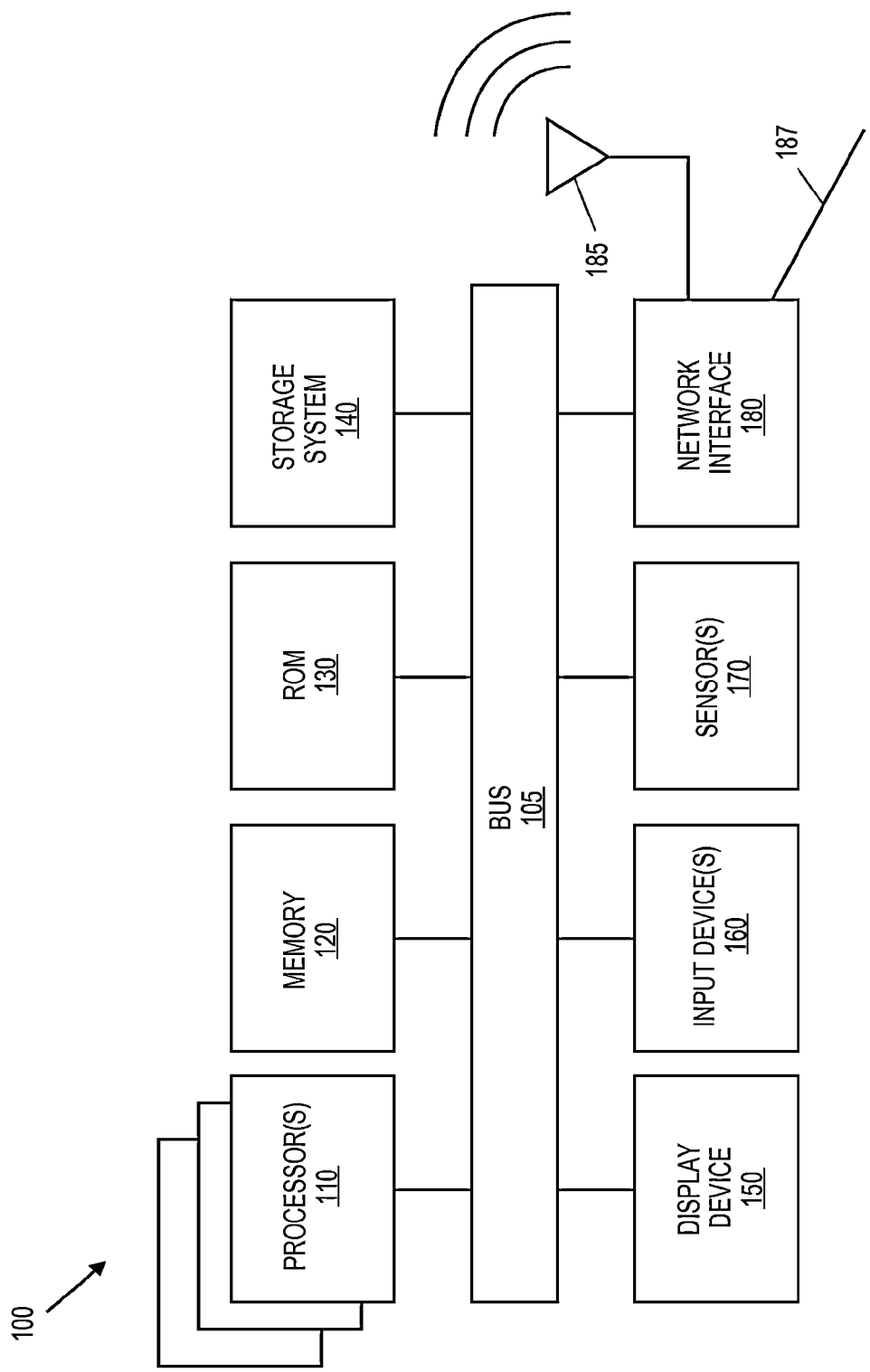
FIG. 1 is a block diagram of one embodiment of an electronic system that may utilize the storage systems described herein.

FIG. 1 is a block diagram of one embodiment of an electronic system. The electronic system illustrated in FIG. 1 is intended to represent a range of electronic systems (either wired or wireless) including, for example, a tablet device, a smartphone, a desktop computer system, a laptop computer system, etc. Alternative electronic systems may include more, fewer and/or different components.

Electronic system 100 includes bus 105 or other communication device to communicate information, and processor(s) 110 coupled to bus 105 that may process information. Electronic system 100 may include multiple processors and/or co-processors. Electronic system 100 further may include random access memory (RAM) or other dynamic storage device 120 (referred to as memory), coupled to bus 105 and may store information and instructions that may be executed by processor 110. Memory 120 may also be used to store temporary variables or other intermediate information during execution of instructions by processor(s) 110.

Electronic system 100 may also include read only memory (ROM) and/or other static storage device 130 coupled to bus 105 that may store static information and instructions for processor 110. Data storage system 140 may be coupled to bus 105 to store information and instructions. Data storage system 140 such as a magnetic disk or optical disc and corresponding drive, solid state drive and/or any combination thereof may be coupled to electronic system 100 or SSD.

Electronic system 100 may also be coupled via bus 105 to display device 150, which can be any type of display device, to display information to a user, for example, a touch screen. Input device 160 may be any type of interface and/or device to allow a user to provide input to electronic system 100. Input device may include hard buttons and/or soft buttons, voice or speaker input, to communicate information and command selections to processor(s) 110.

Electronic system 100 may further include sensors 170 that may be used to support functionality provided by Electronic system 100. Sensors 170 may include, for example, a gyroscope, a proximity sensor, a light sensor, etc. Any number of sensors and sensor types may be supported.

Electronic system 100 further may include network interface(s) 180 to provide access to a network, such as a local area network. Network interface(s) 180 may include, for example, a wireless network interface having antenna 185, which may represent one or more antenna(e). Network interface(s) 180 may also include, for example, a wired network interface to communicate with remote devices via network cable 187, which may be, for example, an Ethernet cable, a coaxial cable, a fiber optic cable, a serial cable, or a parallel cable.

In one embodiment, network interface(s) 180 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported. Network access may also be provided in accordance with 4G/LTE standards as well.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 1: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 180 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Figure 2:
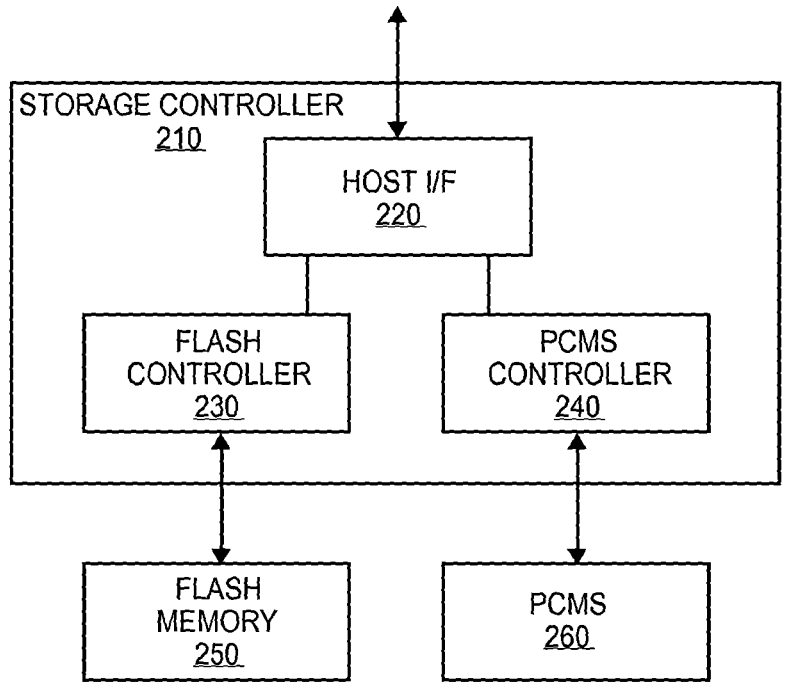
FIG. 2 is a block diagram of one embodiment of a solid state drive.

FIG. 2 is a block diagram of one embodiment of a solid state drive (SSD). The SSD of FIG. 2 can be a part of, for example, storage system 140 as illustrated in FIG. 1. The memory system of FIG. 2 may be utilized in other systems as well. Current SSD devices include both volatile and non-volatile memory (e.g., NAND) and use a logical-to-physical (L2P) indirection system (e.g., a lookup table) to store and retrieve user data. This L2P information and other drive state information together may be referred to as "context." The context is currently maintained in volatile memory and may be periodically backed up to non-volatile memory. This presents opportunities for loss of data, and non-volatile memory bandwidth consumption that may reduce performance.

Described herein are SSD devices/systems that include two types of non-volatile memory (e.g., PCMS and NAND flash) that may provide improved SSD performance and quality of service (QoS) while reducing system complexity. PCMS refers to stacked phase change memory (PCM), which includes multiple levels of phase change memory elements. Power consumption reduction may also be achieved and system complexity may be reduced. The examples herein directed to SSD devices are equally applicable to disk cache systems as well.

In one embodiment, phase change memory (PCM) 260 is stacked phase change memory or PCMS, which may provide significantly higher performance than NAND flash memory. In alternative embodiments, other non-volatile storage technologies may be utilized, for example, ferro-electric transistor random access memory (FeTRAM), nanowire memory, etc. As described in greater detail below, context information that may have previously been saved in volatile memory (e.g., DRAM) may be maintained in PCMS 260.

Because the PCMS is non-volatile, the need for periodic context saves and complex power loss recovery (PLR) techniques may be eliminated. Not only does this reduce product complexity, it also improves performance because context saves using from DRAM to flash consume memory bandwidth. In one embodiment, the PCMS is used to maintain a firmware image that may be used for controlling the flash memory.

In one embodiment, the PCMS may be used to buffer write data and/or store frequently used data. This cache usage of PCMS may improve SSD performance. Because PCMS does not require refreshes, the required power consumption may be reduced as compared to DRAM. In one embodiment, the PCMS may be used to store a firmware image that may be used to for restoration/restart purposes.

Storage controller 210 operates to manage the flow of data between one or more memory devices and a data source (not illustrated in FIG. 2). The data source may be, for example, a processor or other system component that may generate data or utilize data stored in memory. In one embodiment, storage controller 210 includes host interface (I/F) 220 that provides an interface (e.g., SATA, PCIe, SATA SAS) between the functional components of storage controller 210 and the data source.

In one embodiment, host I/F 220 is coupled with flash controller 230 and PCMS controller 240. Flash controller 230 operates to manage data stored by flash memory 250. Flash controller 230 may manage initialization, read operations, write operations, erase operations, error handling wear leveling, block selection and/or garbage collection for flash memory 250. PCMS controller 240 operates to manage data stored by PCMS 260. PCMS controller 240 may manage initialization, read operations, write operations, erase operations, error handling, wear leveling and/or garbage collection for PCMS 260.

In one embodiment, flash controller 230 and flash memory 250 operate to store data used by the data source. Flash controller 230 processes data that passes through host I/F 220 that is to be stored in, or read from, flash memory 250. Context information corresponding to the data stored in flash memory 250 may be stored in PCMS 260 under the control and management of PCMS controller 240.

In one embodiment, flash memory 250 is utilized to store data that will be used by the host system/processor and PCMS is utilized to store context information corresponding to the data stored in flash memory 250. In one embodiment, PCMS 260 may also be utilized as a write buffer for data to be written to flash memory 250. In one embodiment, PCMS 260 may be utilized as a cache for flash memory 250. In one embodiment, PCMS 260 may be used for any combination of these purposes.

Figure 3:
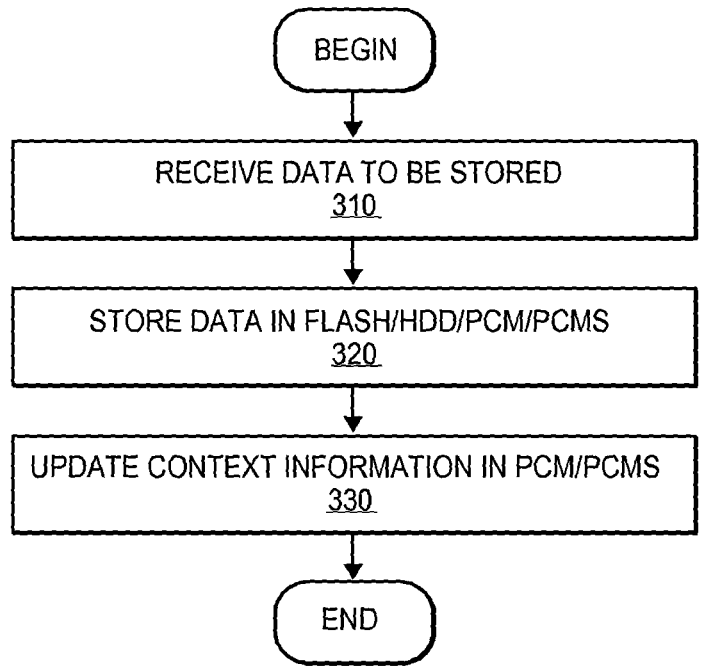
FIG. 3 is a flow diagram for one embodiment of a technique for writing data to a storage system.

FIG. 3 is a flow diagram for one embodiment of a technique for writing data to a storage system. The technique of FIG. 3 may be used, for example, in the system of FIG. 2. The technique of FIG. 3 may be performed by, for example, a memory controller.

Data to be written to the storage system is received, 310. This data may be received from, for example, a processor or any other component of a host system within which the memory controller resides. Any data size or format may be supported.

The data is caused to be stored in the flash memory or HDD, 320 (or PCM/PCMS, depending on caching policies in use). This may be accomplished by, for example issuing commands or control signal to the flash memory or HDD (or PCM/PCMS) along with the data to cause the data to be written to one or more memory locations.

Context information corresponding to the data written to the flash memory/HDD is updated in the PCM/PCMS, 330. In some embodiments, the PCM/PCMS may also be used as a disk cache and/or a write buffer for the flash memory/HDD.

Figure 4:
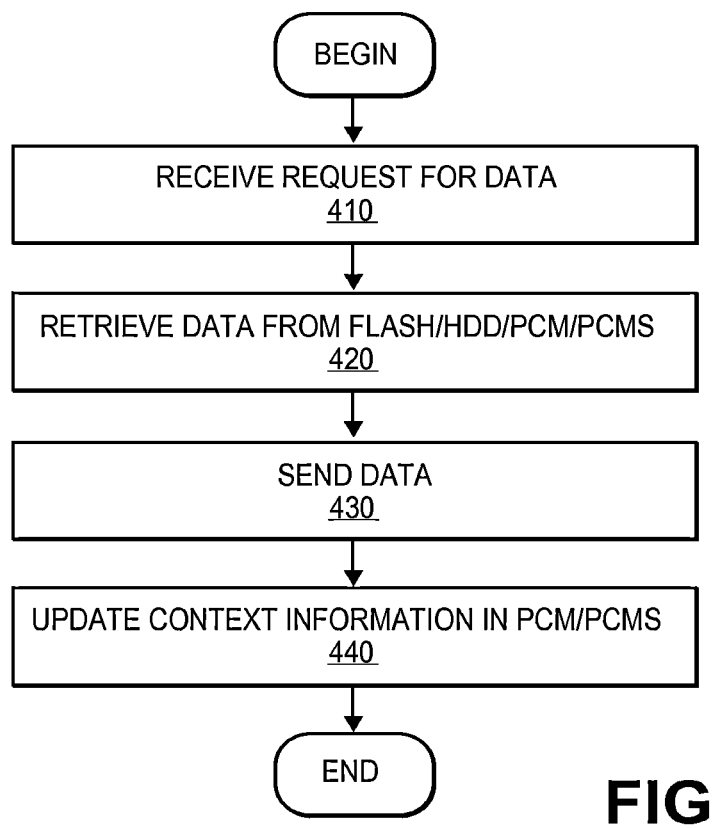
FIG. 4 is a flow diagram of one embodiment of a technique for reading data from a storage system.

FIG. 4 is a flow diagram of one embodiment of a technique for reading data from a storage system. The technique of FIG. 4 may be used, for example, in the system of FIG. 2. The technique of FIG. 4 may be performed by, for example, a storage controller.

A request for data to be read from the storage system is received, 410. This request may be received from, for example, a processor or any other component of a host system within which the storage controller resides. Any data size or format may be supported.

The data is caused to be retrieved from the flash memory or HDD (and/or from PCM/PCMS, depending on the cache state), 420. This may be accomplished by, for example issuing commands or control signal to the flash memory or HDD (or PCM/PCMS) for the data to be read from one or more memory locations.

The data is sent to the requesting system component, 430. Context information corresponding to the data read from the flash memory/HDD is updated in the PCM/PCMS, 440.

Context information corresponding to the data read from the flash memory/HDD is updated in the PCM/PCMS, 440. In some embodiments, the PCM/PCMS may also be used as a disk cache and/or a write buffer for the flash memory/HDD.

Figure 5:
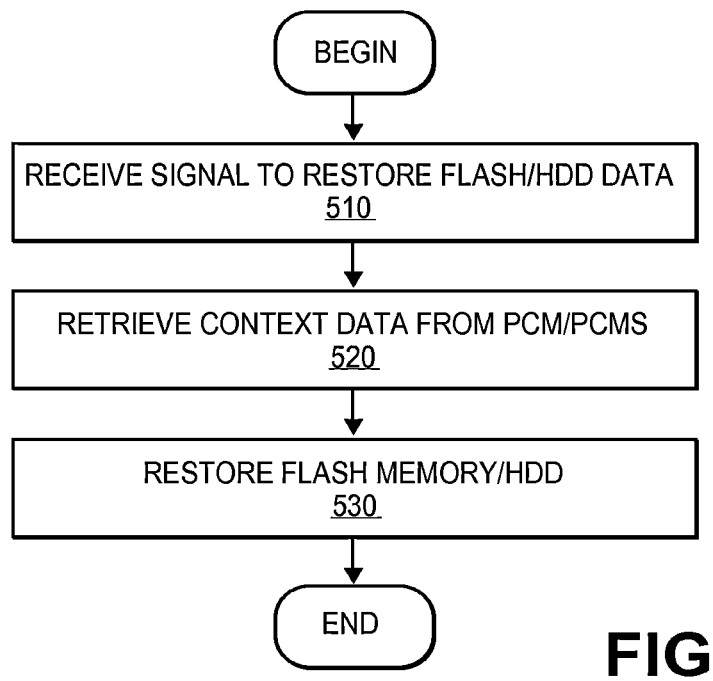
FIG. 5 is a flow diagram of one embodiment for a technique to restore a non-volatile storage device.

FIG. 5 is a flow diagram of one embodiment for a technique to restore a non-volatile memory device. The technique of FIG. 5 may be used, for example, in the system of FIG. 2. The technique of FIG. 3 may be performed by, for example, a storage controller.

A signal is received indicating that data for the flash memory/HDD should be restored, 510. This signal may be received from, for example, a processor, a BIOS, or some other component of the host system.

The relevant context information is retrieved from the PCM/PCMS, 520. Because the PCM/PCMS is non-volatile, updates to the context information are maintained even in the event of power loss. Thus, no reconstruction or recovery processes are required to restore the flash memory/HDD as would be required with storing context information in a volatile memory. Thus, use of PCM/PCMS results in a more efficient restoration process. The flash memory/HDD data are restored, 530.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
a storage controller having an interface to receive commands from a host system;
a first non-volatile, storage device coupled with the storage controller, the first non-volatile storage device to store data received from the host system;
a non-volatile, solid-state memory device coupled with the storage controller, the non-volatile, solid-state memory device to store context information for data stored in the first non-volatile storage device, wherein periodic back-up stores of the context information into the first non-volatile storage device are substantially avoided on account of the context information being kept in non volatile memory, wherein the first non-volatile storage device is comprised of a different type of non volatile storage technology than what that the non-volatile, solid state memory device is comprised of.

2. The apparatus of claim 1 wherein the non-volatile, solid-state memory device is to maintain a firmware image to control the first non-volatile, storage device.

3. The apparatus of claim 1 wherein the non-volatile, solid-state memory device is comprised of a phase change memory (PCM) storage technology.

4. The apparatus of claim 1 wherein the non-volatile, solid-state memory device is comprised of stacked PCM storage technology.

5. The apparatus of claim 1 wherein the first, non volatile storage device is comprised of electrically programmable memory device storage technology.

6. The apparatus of claim 5 wherein the electrically programmable memory device storage technology comprises flash storage technology.

7. The apparatus of claim 6 wherein the flash storage technology comprises NAND flash storage technology.

8. The apparatus of claim 1 wherein the non-volatile, solid-state memory device is to further operate as a write buffer for data to be stored in the first non-volatile, storage device.

9. The apparatus of claim 1 wherein the non-volatile, solid-state memory device is to further operate as a cache memory for the first non-volatile, solid-state memory device.

10. The apparatus of claim 1 wherein the first non volatile storage device comprises a hard disk drive.

11. The apparatus of claim 10 wherein the non-volatile, solid-state memory device is to operate as a disk cache for the hard disk drive.

12. The apparatus of claim 1 wherein the storage controller is part of a an integrated storage device.

13. The apparatus of claim 1 wherein the storage controller is part of the host system.

14. The apparatus of claim 1 wherein at least a portion of the storage controller functionality is provided by instructions executed by the host system.

15. A tablet computing device comprising:
a touch screen interface;
a processor coupled to control the touch screen interface;
a controller having an interface coupled to receive commands from the processor;
a non volatile storage device coupled with the controller, the first non-volatile storage device to store data received from the host system;
a stacked, non flash, non volatile semiconductor memory device coupled with the controller, the stacked, non flash, non volatile semiconductor memory device to store context information of the data stored in the non volatile storage device, wherein periodic back-up stores of the context information into the first non-volatile storage device are substantially avoided on account of the context information being kept in a non volatile memory device, wherein the non volatile storage device and the stacked, non flash, non volatile semiconductor memory device are comprised of different non volatile storage technologies.

16. The tablet of claim 15 wherein the stacked, non flash, non-volatile semiconductor memory device is to store a firmware image to control the non volatile storage device.

17. The tablet of claim 15 wherein the stacked, non flash, non volatile semiconductor memory device comprises a phase change memory (PCM).

18. The tablet of claim 15 wherein the stacked, non flash, non volatile semiconductor memory device is to operate as a write buffer for data to be stored in the non volatile storage device.

19. The tablet of claim 15 wherein the stacked, non flash, non volatile semiconductor memory device is to operate as a cache memory for the data stored in the non-volatile storage device.

20. The tablet of claim 15 wherein the non-volatile, storage device comprises a hard disk drive.

21. The tablet of claim 15 wherein the controller is part of an integrated storage device.

22. The tablet of claim 15 wherein the controller is part of the host system.

* * * * *